United States Patent
Altice, Jr. et al.

(10) Patent No.: US 7,542,085 B2
(45) Date of Patent: Jun. 2, 2009

(54) IMAGE SENSOR WITH A CAPACITIVE STORAGE NODE LINKED TO TRANSFER GATE

(75) Inventors: Peter P. Altice, Jr., Meridian, ID (US); Jeffrey A. McKee, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 979 days.

(21) Appl. No.: 10/721,190

(22) Filed: Nov. 26, 2003

(65) Prior Publication Data

US 2005/0110884 A1    May 26, 2005

(51) Int. Cl.
*H04N 3/14* (2006.01)
*H04N 5/335* (2006.01)
*H01L 27/00* (2006.01)

(52) U.S. Cl. ............... 348/296; 348/302; 348/308; 250/208.1; 257/431; 257/445

(58) Field of Classification Search .......... 348/296, 348/302, 308; 250/208.1; 257/431, 432, 257/444, 445
See application file for complete search history.

(56) References Cited

U.S. PATENT DOCUMENTS

| | | | | |
|---|---|---|---|---|
| 5,523,570 A * | 6/1996 | Hairston | ............... | 250/349 |
| 5,751,005 A * | 5/1998 | Wyles et al. | ............ | 250/370.06 |
| 6,043,478 A * | 3/2000 | Wang | ............... | 250/208.1 |
| 6,091,449 A * | 7/2000 | Matsunaga et al. | ......... | 348/308 |
| 6,107,655 A * | 8/2000 | Guidash | ............... | 257/233 |
| 6,160,281 A * | 12/2000 | Guidash | ............... | 257/292 |
| 6,233,013 B1 * | 5/2001 | Hosier et al. | ............ | 348/308 |
| 6,243,134 B1 * | 6/2001 | Beiley | ............... | 348/308 |
| 6,317,154 B2 * | 11/2001 | Beiley | ............... | 348/308 |
| 6,352,869 B1 * | 3/2002 | Guidash | ............... | 438/16 |
| 6,423,994 B1 * | 7/2002 | Guidash | ............... | 257/292 |
| 6,466,266 B1 * | 10/2002 | Guidash et al. | ............ | 348/308 |
| 6,486,913 B1 * | 11/2002 | Afghahi et al. | ............ | 348/308 |
| 6,522,357 B2 * | 2/2003 | Beiley et al. | ............ | 348/296 |
| 6,552,323 B2 * | 4/2003 | Guidash et al. | ............ | 250/208.1 |
| 6,697,114 B1 * | 2/2004 | Merrill | ............... | 348/308 |
| 6,731,335 B1 * | 5/2004 | Kim et al. | ............... | 348/308 |
| 6,750,912 B1 * | 6/2004 | Tennant et al. | ............ | 348/300 |
| 6,759,641 B1 * | 7/2004 | Loose | ............... | 250/208.1 |
| 6,867,806 B1 * | 3/2005 | Lee et al. | ............... | 348/308 |
| 7,045,754 B2 * | 5/2006 | Manabe et al. | ............ | 250/208.1 |
| 7,053,947 B2 * | 5/2006 | Sohn | ............... | 348/308 |
| 7,064,362 B2 * | 6/2006 | Roy | ............... | 257/225 |
| 7,081,608 B2 * | 7/2006 | Bock | ............... | 250/214 R |
| 7,116,367 B2 * | 10/2006 | Shinohara | ............... | 348/308 |
| 7,238,926 B2 * | 7/2007 | Guidash et al. | ............ | 250/208.1 |
| 7,244,918 B2 * | 7/2007 | McKee et al. | ............ | 250/208.1 |
| 7,250,970 B2 * | 7/2007 | Shinohara | ............... | 348/308 |

\* cited by examiner

*Primary Examiner*—David L Ometz
*Assistant Examiner*—Richard M Bemben
(74) *Attorney, Agent, or Firm*—Dickstein Shapiro LLP

(57) ABSTRACT

A CMOS imaging system with increased charge storage capacitance of pixels yet decreased physical size, kTC noise and active area. A capacitor is linked to the transfer gate and provides a storage node for a pixel, allowing for kTC noise reduction prior to readout. The pixel may be operated with the shutter gate on during the integration period to increase the amount of time for charge storage by a pixel.

22 Claims, 12 Drawing Sheets

IMAGE SENSOR WITH A CAPACITIVE STORAGE NODE LINKED TO TRANSFER GATE

FIELD OF THE INVENTION

The invention relates generally to improving the charge storage capacity of an imager pixel.

BACKGROUND OF THE INVENTION

An imager, for example, a CMOS imager includes a focal plane array of pixel cells; each cell includes a photosensor, for example, a photogate, photoconductor or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion node, connected to the gate of the source follower transistor. Charge generated by the photosensor is sent to the floating diffusion node. The imager includes a transistor for transferring charge from the photosensor to a storage node, and a transistor for transferring charge from the storage node to the floating diffusion node. The imager also includes a transistor to reset the floating diffusion node.

FIG. 1 illustrates a block diagram of a CMOS imager device 908 having a pixel array 200 with each pixel cell being constructed as described above. Pixel array 200 comprises a plurality of pixels arranged in a predetermined number of columns and rows. The pixels of each row in array 200 are all turned on at the same time by a row selected line, and the pixels of each column are selectively output by respective column select lines. A plurality of rows and column lines are provided for the entire array 200. The row lines are selectively activated in sequence by the row driver 210 in response to row address decoder 220 and the column select lines are selectively activated in sequence for each row activation by the column driver 260 in response to column address decoder 270. Thus, a row and column address is provided for each pixel. The CMOS imager is operated by the control circuit 250, which controls address decoders 220, 270 for selecting the appropriate row and column lines for pixel readout, and row and column driver circuitry 210, 260 which apply driving voltage to the drive transistors of the selected row and column lines. The pixel output signals typically include a pixel reset signal, $V_{rst}$ taken off of the floating diffusion node when it is reset and a pixel image signal, $V_{sig}$, which is taken off the floating diffusion node after charges generated by an image are transferred to it. The $V_{rst}$ and $V_{sig}$ signals are read by a sample and hold circuit 265 and are subtracted by a differential amplifier 267, which produces a signal $V_{rst}$–$V_{sig}$ for each pixel, which represents the amount of light impinging on the pixels. This difference signal is digitized by an analog to digital converter 275. The digitized pixel signals are then fed to an image processor 280 to form a digital image. The digitizing and image processing can be on or off the imager chip.

Imager pixels, including CMOS imager pixels, typically have low signal to noise ratios and narrow dynamic range because of their inability to fully collect, transfer and store the electric charge collected by the photosensitive area of the photosensor. In addition, the pixels are subject to kTC noise, which is thermal dependant noise generated during the reset of the pixel. The kTC noise refers to the random variations of voltage during the reset of a diffusion area or capacitor.

Since the size of the pixel electrical signal is very small due to the collection of photons in the photo array, the signal to noise ratio and dynamic range of the pixel should be as high as possible. In addition, the use of additional gates to increase the functional operations of the pixel (i.e., electronic shuttering) increases the size of the pixel or reduces the fill factor of the pixel. There is needed, therefore, an improved pixel photosensor for use in an imager with decreased noise and size, and larger storage capacitance which occupies a relatively small area in the silicon.

BRIEF SUMMARY OF THE INVENTION

The present invention provides increased storage capacity for an imager. In a first embodiment of the imager, e.g., a CMOS imager, each pixel has a global electronic shutter that transfers the image electrons to a storage node before further transferring these electrons to the pixel's floating diffusion node. The storage node is capacitively linked to the shutter clock to increase the storage capacitance of the storage node and to clock (i.e., drive) charges by increasing and decreasing the potential at the storage node. By including an additional storage node in the pixel, the floating diffusion node can be reset and readout prior to charge transference to the floating diffusion node, which allows for double sampling and a reduction of kTC noise. The amount of charge in which a pixel can store also increases since the storage node has a greater charge storage capacitance than the floating diffusion node.

In a second embodiment, two pixels having respective storage nodes share a floating diffusion node and reset and readout circuitry. In addition to an increased storage capacity, the charge generating area of the pixels is increased because the area normally devoted to a second floating diffusion node, and reset and readout circuitry is now shared by the two pixels. Since two pixels share a floating diffusion node and reset and readout circuitry, a shutter clock for the first pixel is clocked onto the floating diffusion node to correctly readout and output an image. Once the readout and output of the first pixel occurs, the floating diffusion node is reset and the shutter clock for the second pixel is clocked onto the same floating diffusion node for output in the same fashion as the first pixel.

In a third embodiment, four pixels using the storage node described above share a floating diffusion node and reset and readout circuitry. This further increases the charge generating area of the pixels by using the area formerly designated for use by three floating diffusion nodes and associated reset and readout circuitry to increase the charge generating area of each pixel. Since four pixels share a floating diffusion node, and reset and readout circuitry, the two pixels sharing a column or row are output during the same clock cycle. This occurs by clocking the first pixel onto the floating diffusion node and resetting the floating diffusion node on a first half clock cycle. The second pixel is subsequently clocked onto the floating diffusion node during a second half clock cycle for readout and output. This operation is repeated for output of the third and fourth pixel, each of which is output on a half cycle of the second clock cycle.

In addition, a function that may be included to further increase the performance of the CMOS imager embodiments is operating the CMOS pixel with the shutter gate of the imager in an open position during a charge integration period. Having the gate open during the integration period allows additional time for a charge to be collected and transferred to the storage node. As a result, the size of the shutter gates can be reduced and the pixel has a larger charge storage capacitance.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The terms "wafer" and "substrate" are to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit cell containing a photoconversion device or photosensor and transistors for processing an electrical signal from electromagnetic radiation sensed by the photoconversion device. The pixels discussed herein are illustrated and described as inventive modifications to four transistor (4T) pixel circuits for the sake of example only. It should be understood that the invention may be used with other pixel arrangements having fewer (e.g., 3T) or more (e.g., 5T) than four transistors. Although the invention is described herein with reference to the architecture and fabrication of one pixel, it should be understood that this is representative of a plurality of pixels in an array of an imager device. In addition, although the invention is described below with reference to a CMOS imager, the invention has applicability to any solid state imaging device having pixels. The following detailed description is, therefore, not to be taken in a limiting sense, and the scope of the present invention is defined only by the appended claims.

Figure 2:
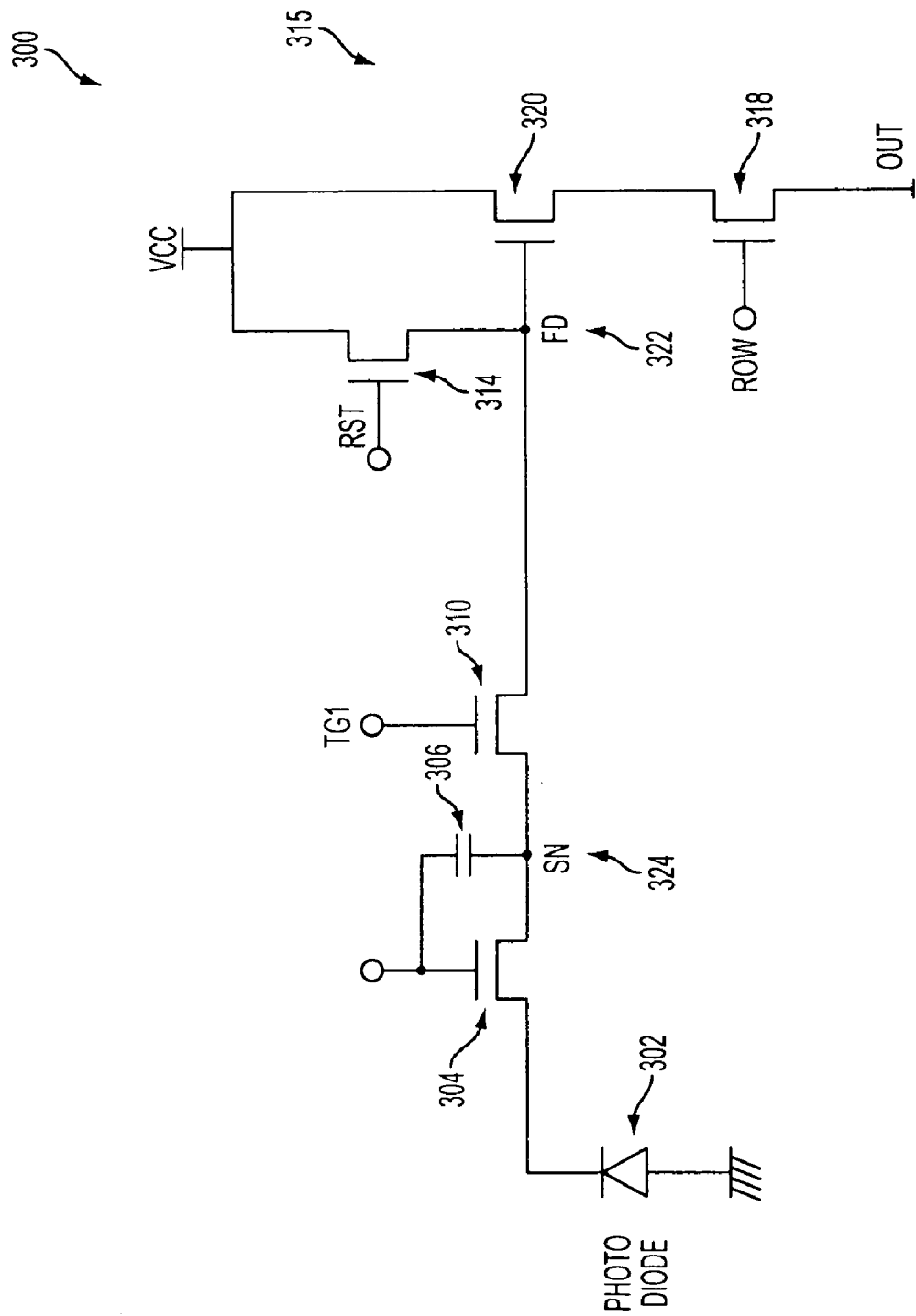
FIG. 2 is a schematic circuit diagram of an exemplary five transistor pixel according to a first embodiment of the invention.

FIG. 2 illustrates an exemplary circuit 300 for a pixel of a CMOS imager according to a first exemplary embodiment of the invention. The pixel includes a photosensor, e.g. a photodiode 302, shutter gate transistor 304, storage node 324, capacitor 306, transfer gate transistor 310, a floating diffusion node 322, and a reset and readout circuit 315 including reset transistor 314, source follower transistor 320 and row select transistor 318.

Figure 9:
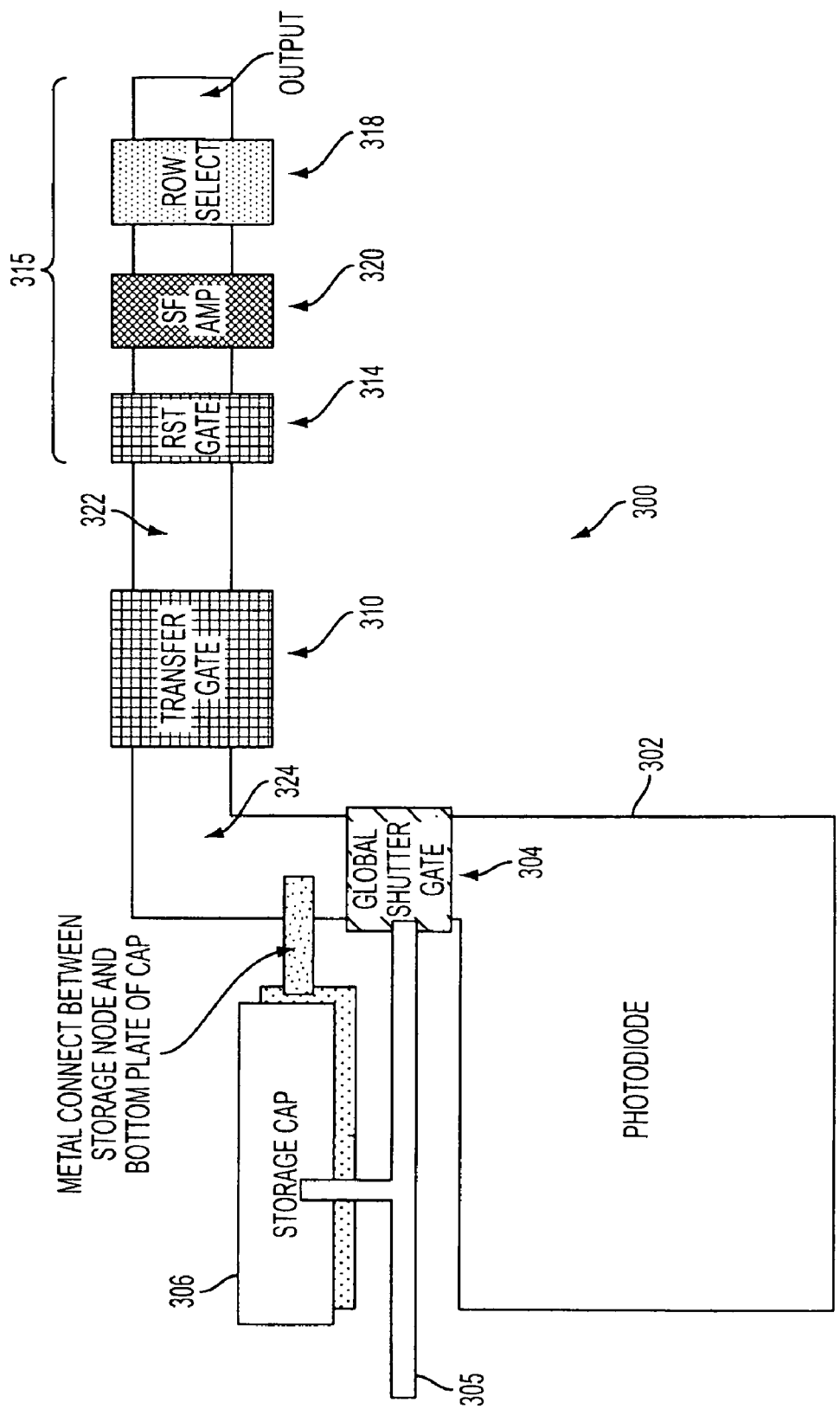
FIG. 9 is a top down diagram of an exemplary pixel circuit according to a first embodiment of the invention.

FIG. 9 is a top down illustration of circuit 300 showing photodiode 302 connected to shutter gate transistor 304. Shutter gate transistor 304 is connected to storage capacitor 306 via a global shutter line 305. Capacitor 306 may be, for example, a polypropylene capacitor and is formed above the substrate containing the other element of circuit 300. Capacitor 306 is connected to storage node 324. Storage node 324 is connected to transfer gate transistor 310 which is coupled to the readout circuit 315 via floating diffusion node 322. Tying storage capacitor 306 to shutter gate transistor 304 drives storage node 324 to a high potential when transferring charge from the photodiode 302 to the storage node 324. Reducing the voltage on storage node 324 allows charge transfer from the storage node 324 to the floating diffusion node 322.

The pixel 300 illustrated in FIGS. 2 and 9 is formed on a semiconductor substrate and utilizes intermediate storage node 324 via capacitor 306 for storing charge from photodiode 302. As photodiode 302 generates signal charge in response to incident light, the charge is transferred via the shutter gate transistor 304 to storage node 324 connected to the capacitor 306.

Figure 5:
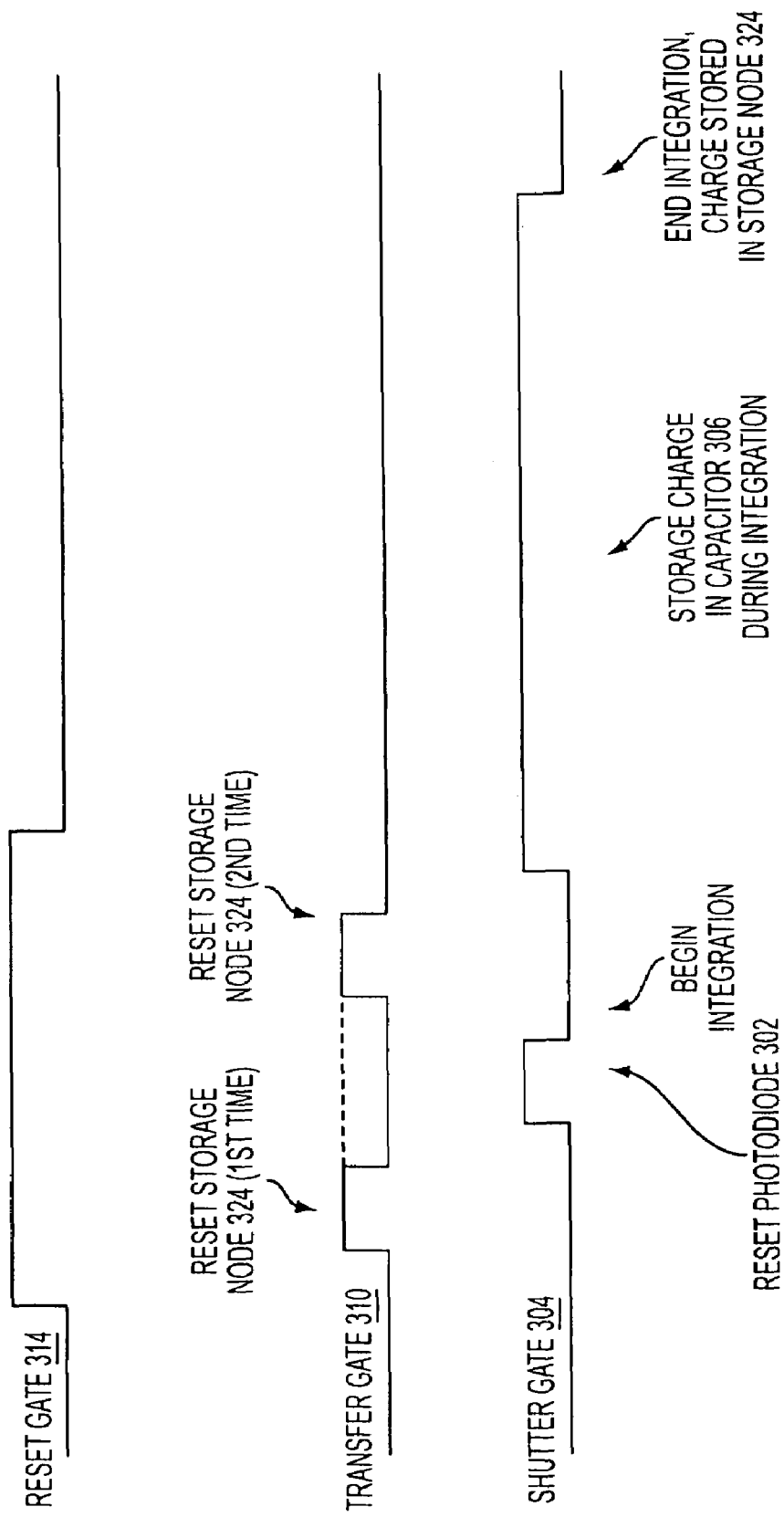
FIG. 5 is a timing diagram of charge storage integration according to a first embodiment of the invention.

The timing of charge storage in capacitor 306 occurs by first resetting storage node 324, resetting photodiode 302, and resetting storage node 324 a second time, which is illustrated in FIG. 5. Alternatively, the pixel could be processed to have the potential under the shutter gate transistor 304 lower than the potential under the transfer gate transistor 310 when both gates are on such that storage node 324 could be reset by holding the transfer gate transistor 310 high (as depicted by the dotted line) and cycling the shutter gate transistor 304. In either case, the gate of reset transistor 314 should be high during reset of storage node 324 to ensure that the floating diffusion node 322 is maintained at a high potential.

Subsequent to storage node's 324 second reset, charge received from photodiode 302 is transferred to storage capacitor 306 during a charge integration period; however, charge received from photodiode 302 could also be transferred to storage capacitor 306 after the charge integration period. The storage capacitor 306 permits a greater amount of charge to be stored at node 324. Consequently, the capacitive storage of the pixel is increased.

In addition, because the charge transferred from photodiode 302 is stored in a storage node 324, the floating diffusion node 322 can be reset during the same frame the image is captured. This permits a correlated double sampling operation resulting in a sharper image. The charge residing at storage node 324 is subsequently transferred to the floating diffusion node 322 by the transfer gate 310, where the charge is applied to the gate of source follower transistor 320 for readout through row select transistor 318.

Figure 6:
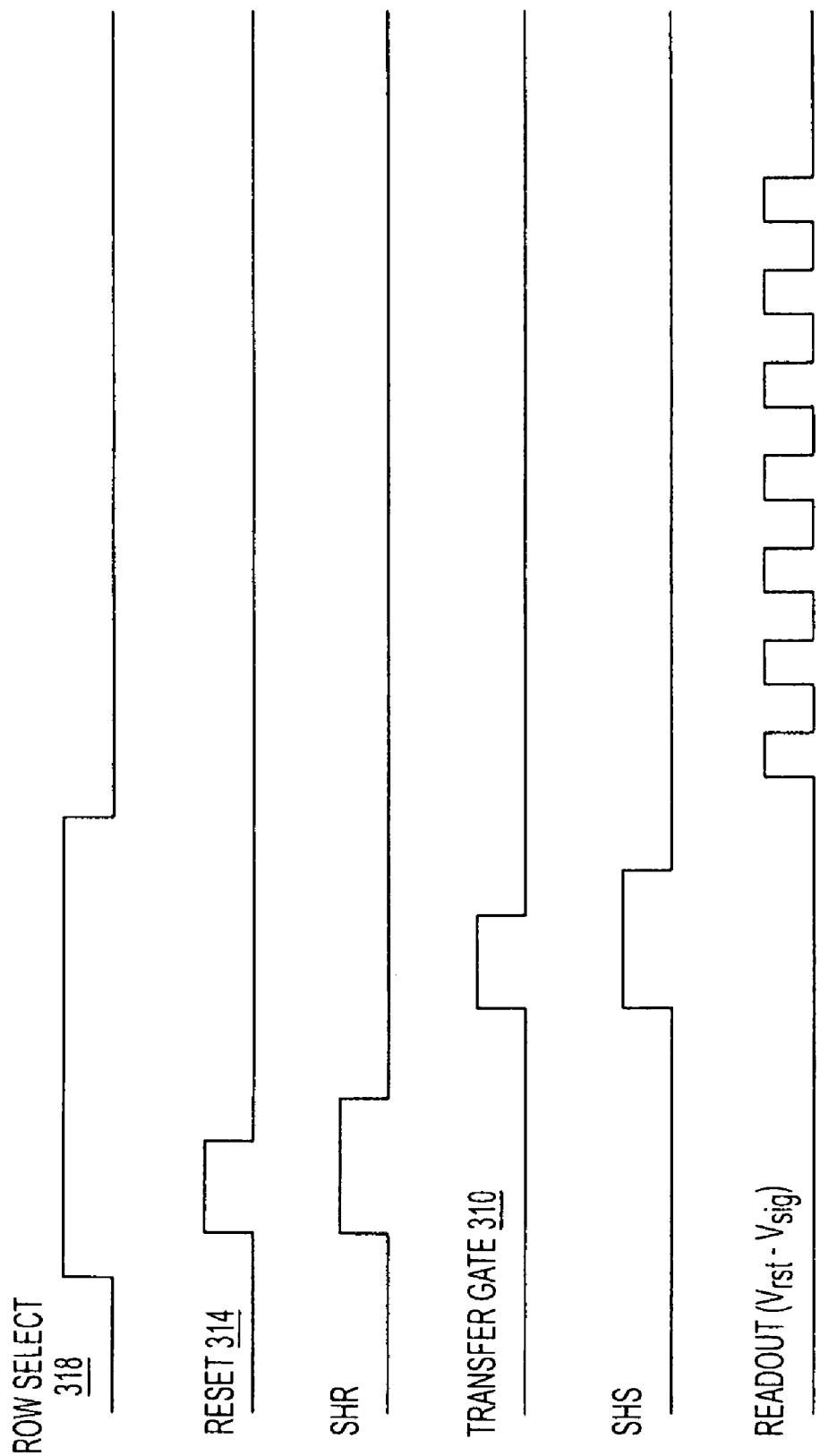
FIG. 6 is a timing diagram of charge readout according to a first embodiment of the invention.

FIG. 6 illustrates an output timing diagram for circuit 300 (FIG. 2) during pixel readout. The row select transistor 318 is pulsed, turning on the row select transistor 318. Reset transistor 314 is briefly turned on, thereby resetting floating diffusion node 322 to a predetermined voltage. The charge on the floating diffusion node 322 is applied to the gate of source follower transistor 320, which is translated to a voltage and subsequently sampled by sample and hold circuitry, where a pulse in SHR represents a time when the reset voltage is stored on a sample and hold capacitor.

Charge stored in storage capacitor 306 is then transferred to floating diffusion node 322 by turning on transfer gate transistor 310. The charge on the floating diffusion node 322 is applied to the gate of source follower transistor 320, which is translated to a voltage and subsequently sampled by sample and hold circuitry for readout, where a pulse in SHS represents a time when the signal voltage is stored in a sample and hold capacitor.

The FIG. 2 circuit 300 operates using a global electronic shutter, for example, shutter gate 304, which allows an input signal, i.e., incident light, to be applied simultaneously across an imager array so each row of pixels in the array acquires the charge from respective photodiodes at the same time. When acquiring an image, the integration cycle for each row is the same. Once the image has been acquired, the charge from each pixel is transferred to a storage node for readout. The readout occurs row-by-row; however, the input for each row's image is captured simultaneously. Thus, the actual time in which signal acquisition begins and ends is different from row to row. Consequently, each row in the array is integrated separately, but the time that each row acquires a signal is the same.

Figure 3:
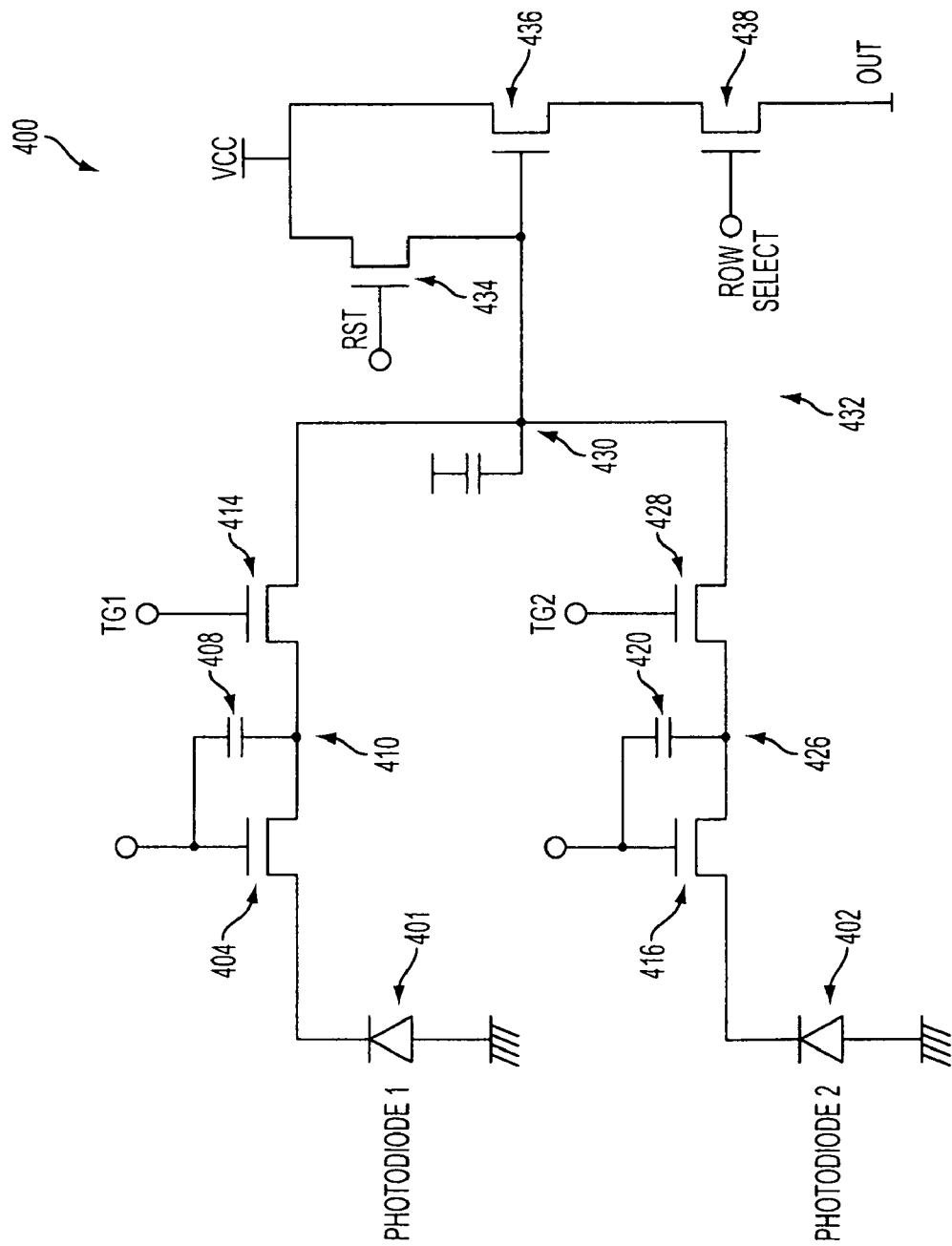
FIG. 3 is a schematic circuit diagram of an exemplary circuit in which two pixels share readout circuitry according to a second embodiment of the invention.

The FIG. 2 circuit 300 employs one floating diffusion node 322 per pixel. FIG. 3 illustrates a second exemplary embodiment of the invention in which two pixels share a floating diffusion node 430 and reset and readout circuitry 432, which includes a reset transistor 434, source follower transistor 436 and row select transistor 438. The illustrated circuit 400 includes two pixels, each including respective photodiodes 401, 402, shutter gate transistors 404, 416, storage nodes 410, 426, capacitors 408, 420, and transfer gate transistors 414, 428. The two pixels share readout circuit 432 and floating diffusion node 430. A single output line out is provided for the two pixels.

Figure 10:
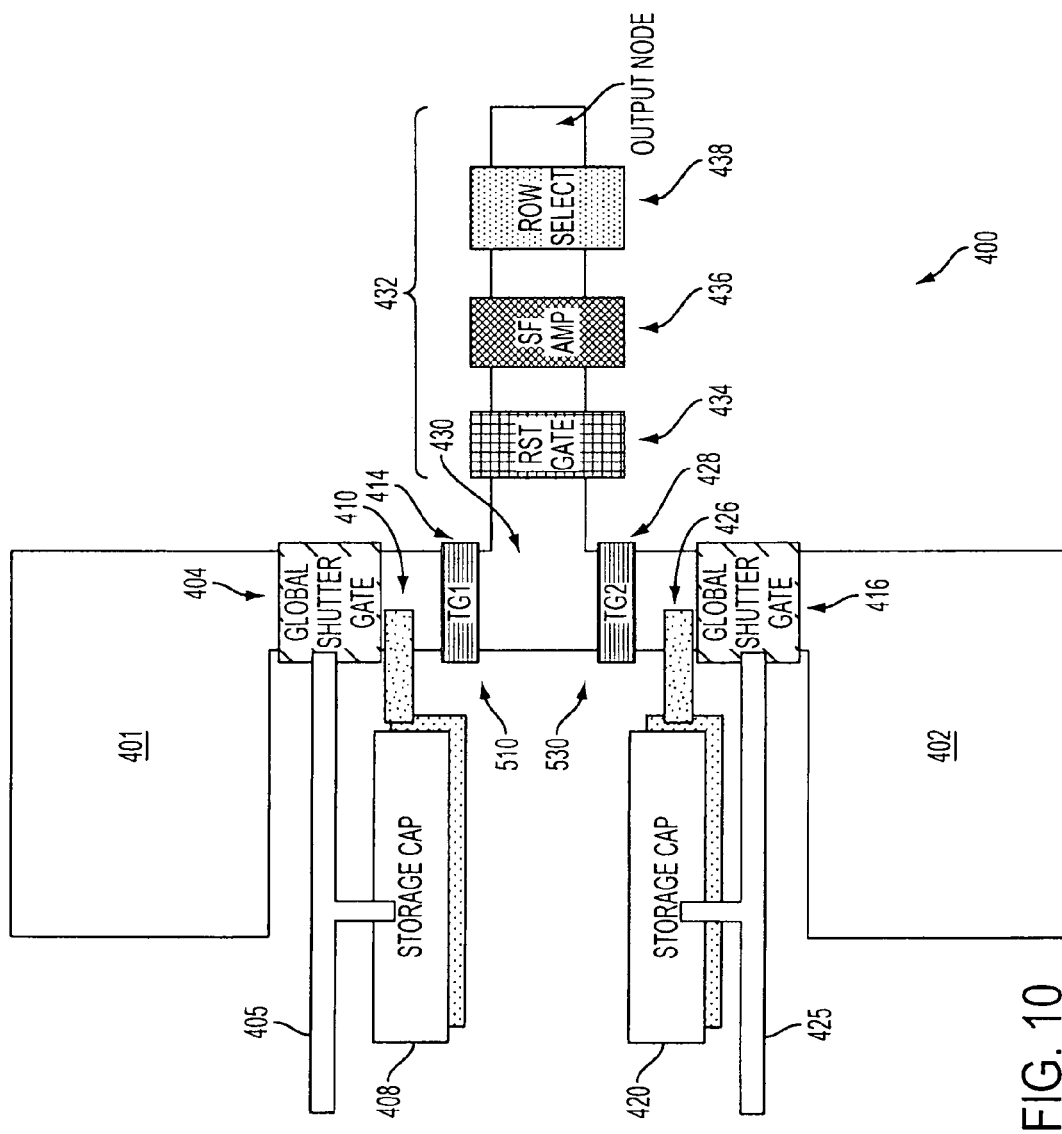
FIG. 10 is a top down diagram of an exemplary pixel circuit according to a second embodiment of the invention.

FIG. 10 is a top down illustration of circuit 400 showing photodiode 401 connected to shutter gate transistor 404. Shutter gate transistor 404 is connected to storage capacitor 408 via a first shutter line 405. Capacitor 408 is connected to storage node 410. Storage node 410 is connected to transfer gate transistor 414 for charge transference to the circuit 432 for a first charge readout. Photodiode 402 is connected to shutter gate transistor 416. Shutter gate transistor 416 is connected to storage capacitor 420 via a second shutter line 425. Capacitor 420 is connected to storage node 426. Storage node 426 is connected to transfer gate transistor 428 for charge transference to the same shared reset and readout circuit 432 used by the first pixel for a second charge readout.

Because multiple pixels are being readout by the same circuit 432 to display an image, pixel timing is set to allow readout of each pixel based on its predetermined position in the imager array. When the two pixels sharing circuit 432 reside in the same row or column, two transfer gates 414, 428 are utilized to clock the respective pixel signals into the floating diffusion node 430 at the required timing. For example, the transfer gate 414 of the first pixel is turned on, transferring the charge residing in the storage node 410 to the floating diffusion node 430. This charge is then readout by turning the row select transistor 438 on. Once the row select transistor 438 and source follower transistor 436 outputs the charge, the floating diffusion node 430 is reset by turning the reset transistor 434 on. Once the floating diffusion node 430 is reset, the charge from the second pixel can be readout using the same technique. As a result, the row select transistor 438 would be on for both transfers in order to readout both pixels within in a cycle.

Figure 7:
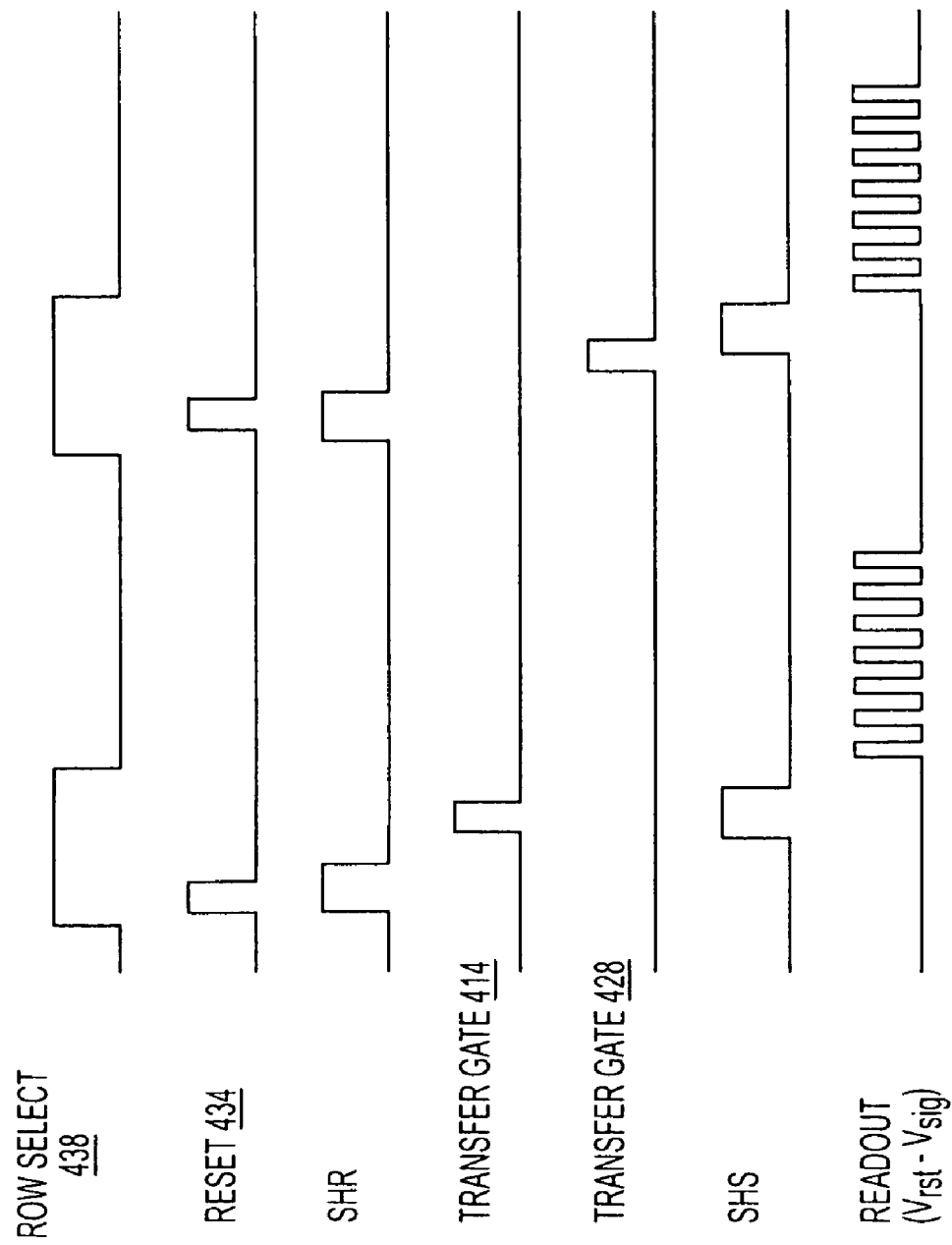
FIG. 7 is a timing diagram of charge readout according to a second embodiment of the invention.

FIG. 7 illustrates the output timing of circuit 400 (FIG. 3) during pixel readout. The row select transistor 438 is pulsed on. Reset transistor 434 is briefly turned on, thereby resetting floating diffusion node 430 to a predetermined voltage. The charge on the floating diffusion node 430 is applied to the gate of source follower transistor 436, which is translated to a voltage and subsequently sampled by sample and hold circuitry, where a pulse in SHR represents the time when the reset voltage is stored on the sample and hold capacitor.

Charge stored in storage capacitor 410 is then transferred to floating diffusion node 430 by turning transfer gate transistor 414 on. The charge on the floating diffusion node 430 is applied to the gate of source follower transistor 436, which is translated to a voltage and subsequently sampled by sample and hold circuitry, where a pulse in SHS represents the time when the signal voltage is stored in the sample and hold capacitor. Photodiode 401 is subsequently reset.

The readout technique is then repeated to readout a charge accumulated by the second pixel, and results in charge transference from capacitor 420 through transfer gate transistor 428 and onto the same floating diffusion node 430 for readout. Readout from each respective pixel signal occurs in a single output cycle. Consequently, the readout of pixel circuit 400 uses two clock cycles.

The circuit 400 has the same benefits as circuit 300, and additionally allows for the use of a photodiode with increased charge generation area since two photodiodes 401, 402 share a floating diffusion node and additional circuitry is not required to couple the signals from nodes 410, 426 to the common floating diffusion node 430.

Figure 4:
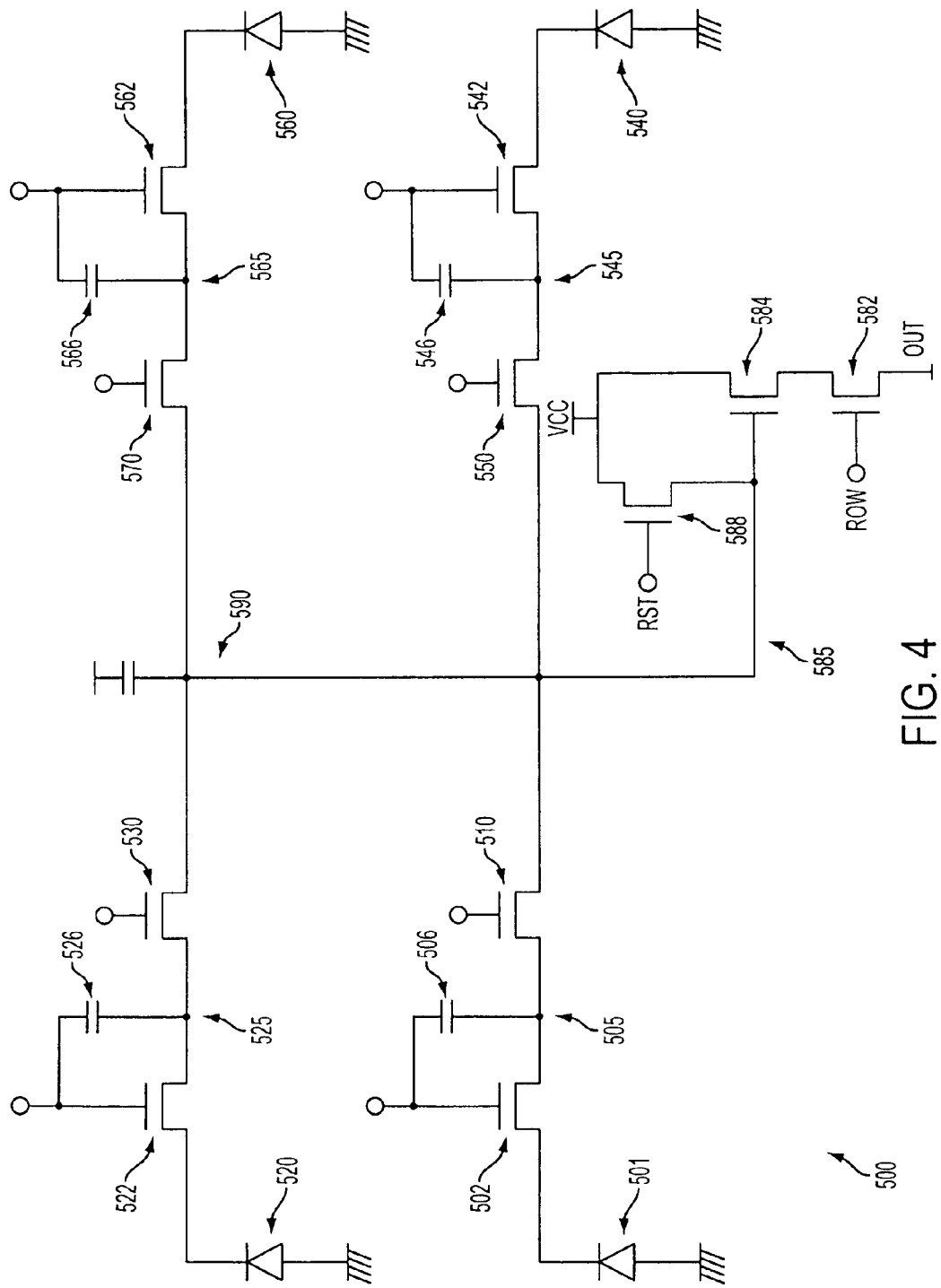
FIG. 4 is a schematic circuit diagram of an exemplary circuit in which four pixels share readout circuitry according to a third embodiment of the invention.

FIG. 4 illustrates a pixel circuit 500 of a CMOS imager according to a third exemplary embodiment of the invention. In this embodiment, four pixels share a floating diffusion node 590, and reset and readout circuit 585. The four pixels comprise respective photodiodes 501, 520, 540, 560, shutter gate transistors 502, 522, 542, 562, storage nodes 505, 525, 545, 565, capacitors 506, 526, 546, 566, transfer gate transistors 510, 530, 550, 570, and each pixel shares reset and readout circuit 585, which includes reset transistor 588, source follower transistor 584 and row select transistor 582.

Figure 11:
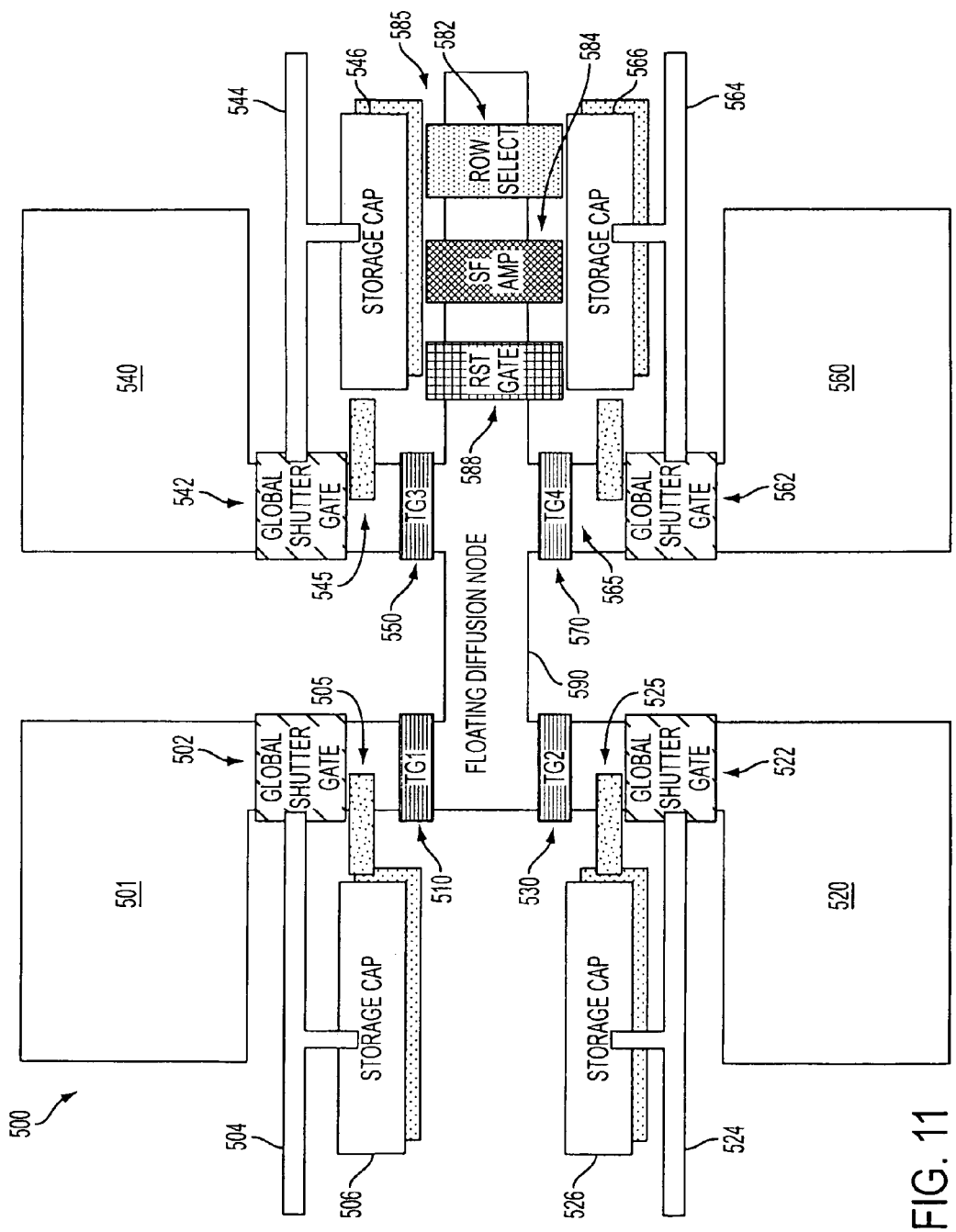
FIG. 11 is a top down diagram of an exemplary pixel circuit according to a third embodiment of the invention.

FIG. 11 is a top down illustration of circuit 500 showing photodiode 501 connected to shutter gate transistor 502. Shutter gate transistor 502 is connected to storage capacitor 506 via a first shutter line 504. Capacitor 506 is connected to storage node 505. Storage node 505 is connected to transfer gate transistor 510 for charge transference to readout circuit 585 via floating diffusion node 590 for a first charge readout.

Photodiode 520 is connected to shutter gate transistor 522. Shutter gate transistor 522 is connected to storage capacitor 526 via a second shutter line 524. Capacitor 526 is connected to storage node 525. Storage node 525 is connected to transfer gate transistor 530 for charge transference to the readout circuit 585 via floating diffusion node 590 during a second charge readout.

Photodiode 540 is connected to shutter gate transistor 542. Shutter gate transistor 542 is connected to storage capacitor 546 via a third shutter line 544. Capacitor 546 is connected to storage node 545. Storage node 545 is connected to transfer gate transistor 550 for charge transference to the readout circuit 585 via floating diffusion node 590 during a third charge readout. Photodiode 560 is connected to shutter gate transistor 562. Shutter gate transistor 562 is connected to storage capacitor 566 via a fourth shutter line 564. Capacitor 566 is connected to storage node 565. Storage node 565 is connected to transfer gate transistor 570 for charge transference to the readout circuit 585 via floating diffusion node 590 during a fourth charge readout.

Because four pixels are being readout by the same readout circuit 585, the readout process is similar to the readout of the second embodiment (FIG. 3) but altered to output twice the number of signals than that of the second embodiment. When the readout circuit 585 reads out an image using pixels that reside in the same row or column, the two of the four transfer gates (510 and 550 or 530 and 570) associated with a corresponding photosensor (501 and 540 or 520 and 560) are utilized to clock a pixel signal onto the floating diffusion node 590 with the required timing.

Figure 8:
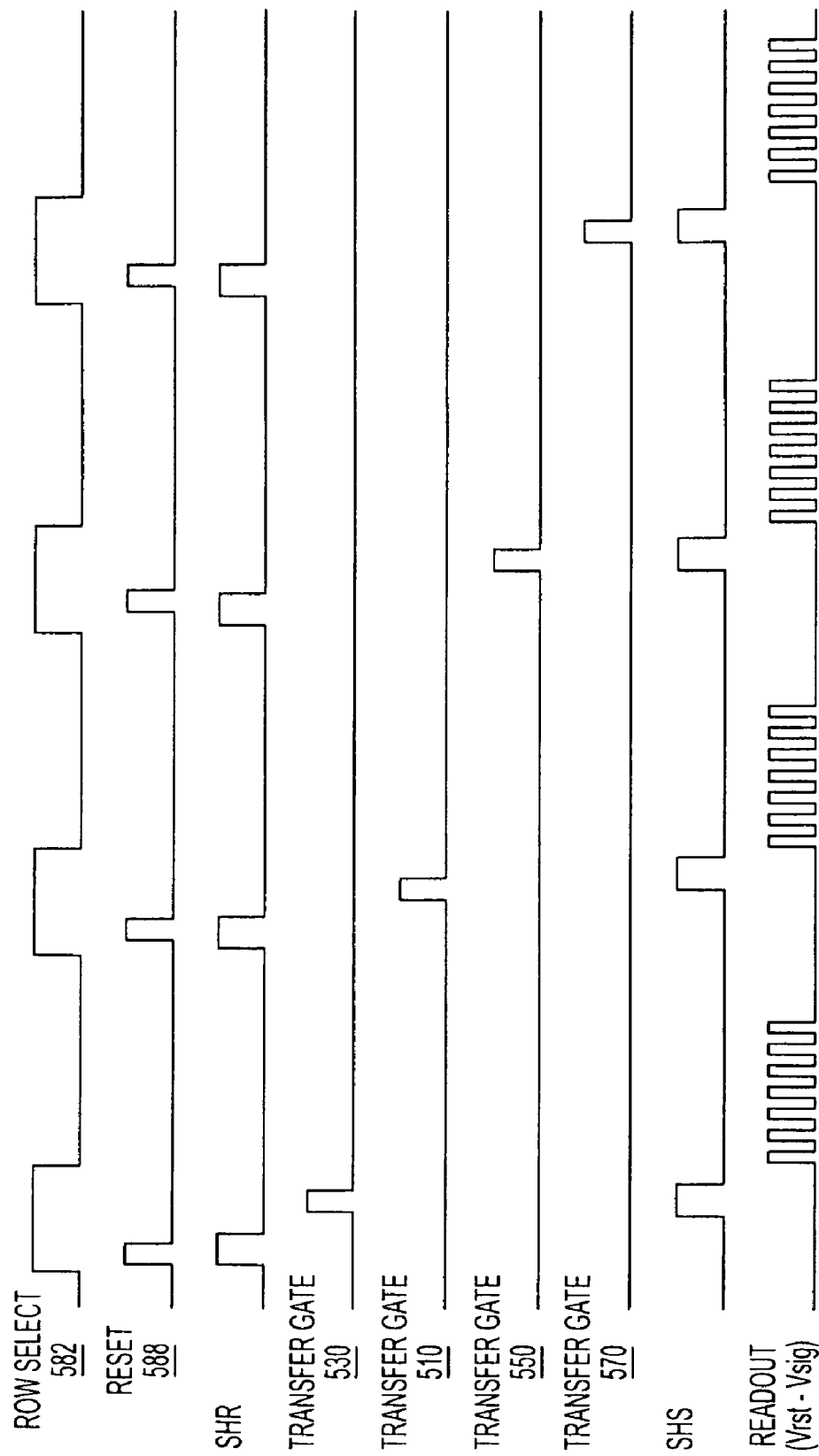
FIG. 8 is a timing diagram of charge readout according to a third embodiment of the invention.

FIG. 8 illustrates the output timing of circuit 500 (FIG. 4) during pixel readout. The row select transistor 582 is pulsed on by a row select signal. Reset transistor 588 is briefly turned on, thereby resetting floating diffusion node 590 to a predetermined voltage. The charge on the floating diffusion node 590 is applied to the gate of source follower transistor 584, which is translated to a voltage and subsequently sampled by sample and hold circuitry, where a pulse in SHR represents the time when the reset voltage is stored on the sample and hold capacitor.

Charge stored in storage capacitor 526 is then transferred to floating diffusion node 590 by turning transfer gate transistor 530 on. The charge on the floating diffusion node 590 is applied to the gate of source follower transistor 584, which is translated to a voltage and subsequently sampled by sample and hold circuitry, where a pulse in SHS represents the time when the signal voltage is stored in the sample and hold capacitor. the values in the sample and hold capacitors can be subtracted to obtain a differential signal readout ($V_{rst}$–$V_{sig}$). Photodiode 520 is subsequently reset.

The readout technique is then repeated to readout each signal from the remaining pixels of circuit 500. Charge accumulated by capacitor 506 from photodiode 501 in response to its respective pixel signal is transferred from capacitor 506 through transfer gate transistor 510 and onto floating diffusion node 590. Charge accumulated by capacitor 546 from photodiode 540 in response to its respective pixel signal is transferred from capacitor 546 through transfer gate transistor 550 and onto floating diffusion node 590. Charge accumulated by capacitor 566 from photodiode 560 in response to its respective pixel signal is transferred from capacitor 566 through transfer gate transistor 570 and onto floating diffusion node 590.

The readout timing of circuit 500 uses two clock cycles; however, since four pixels are being output in the two clock cycles, the readout of each pixel signal occurs on a half clock cycle allowing the readout of two pixels per output clock cycle. The row select transistor 582 is on for all four transfers.

The circuit 500 illustrated in FIG. 4 operates similarly to circuit 400 illustrated in FIG. 3; however, four adjacent photodiodes 501, 520, 540, 560 share the floating diffusion node 590 and reset and readout circuit 585. With four pixels sharing circuitry in the circuit 500, the photodiode areas can be further increased due to the reduction in the number of floating diffusion nodes, and reset transistors and readout circuits.

Figure 1:
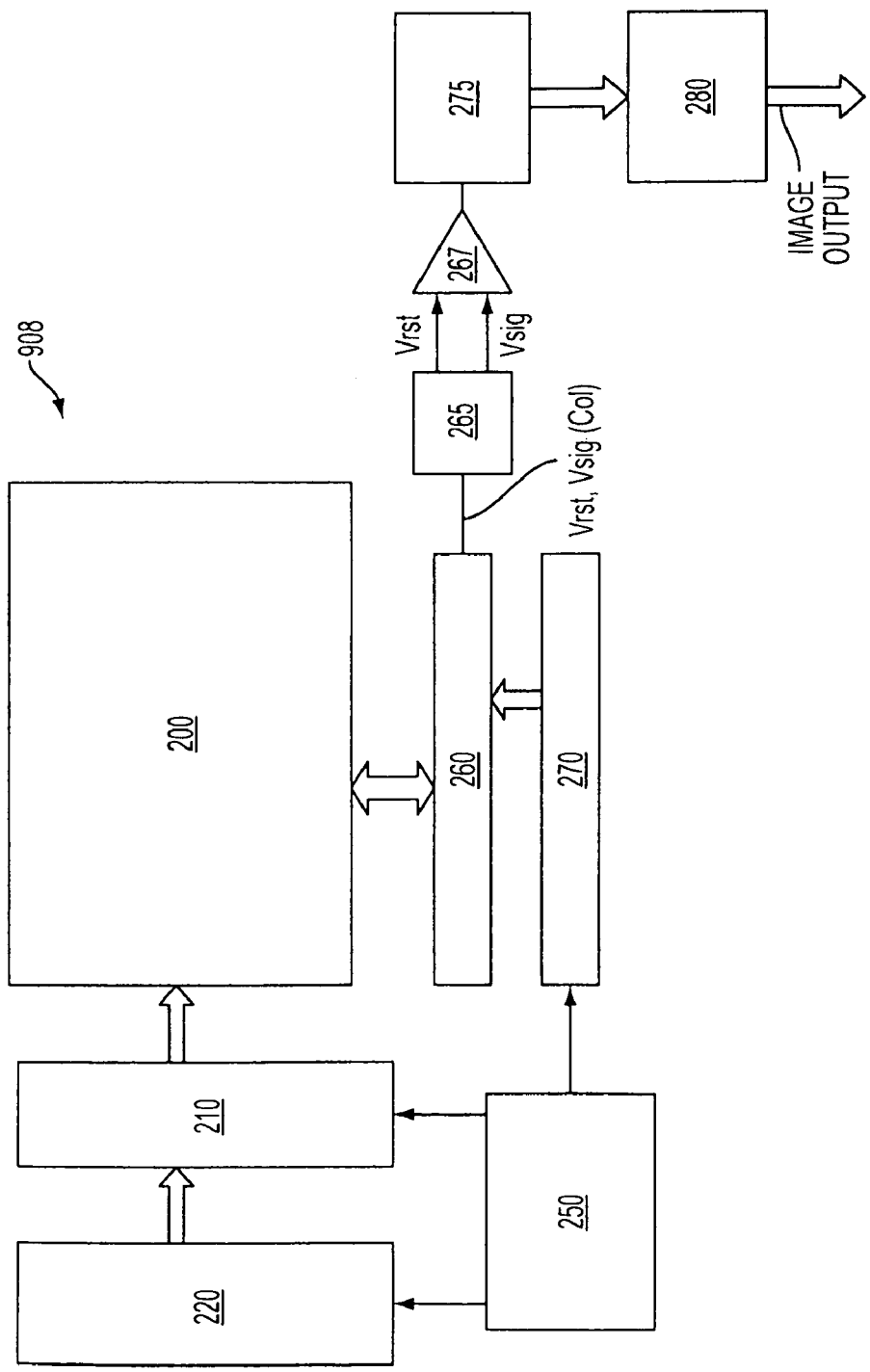
FIG. 1 is a block diagram of a conventional CMOS imager.

Charge storage capacity of each of the exemplary embodiments depicted in FIGS. 2-11 can be further increased by leaving the shutter gate on during the photodiode integration period. By allowing the shutter gate to remain on during integration, there is additional time for the photodiode to transfer the charge to the storage node. Consequently, the physical size of the shutter gate can be decreased. The pixels of the three exemplary embodiments (FIGS. 2-11) may be used to form a pixel array 200 for use in an imaging device 908 (FIG. 1).

Figure 12:
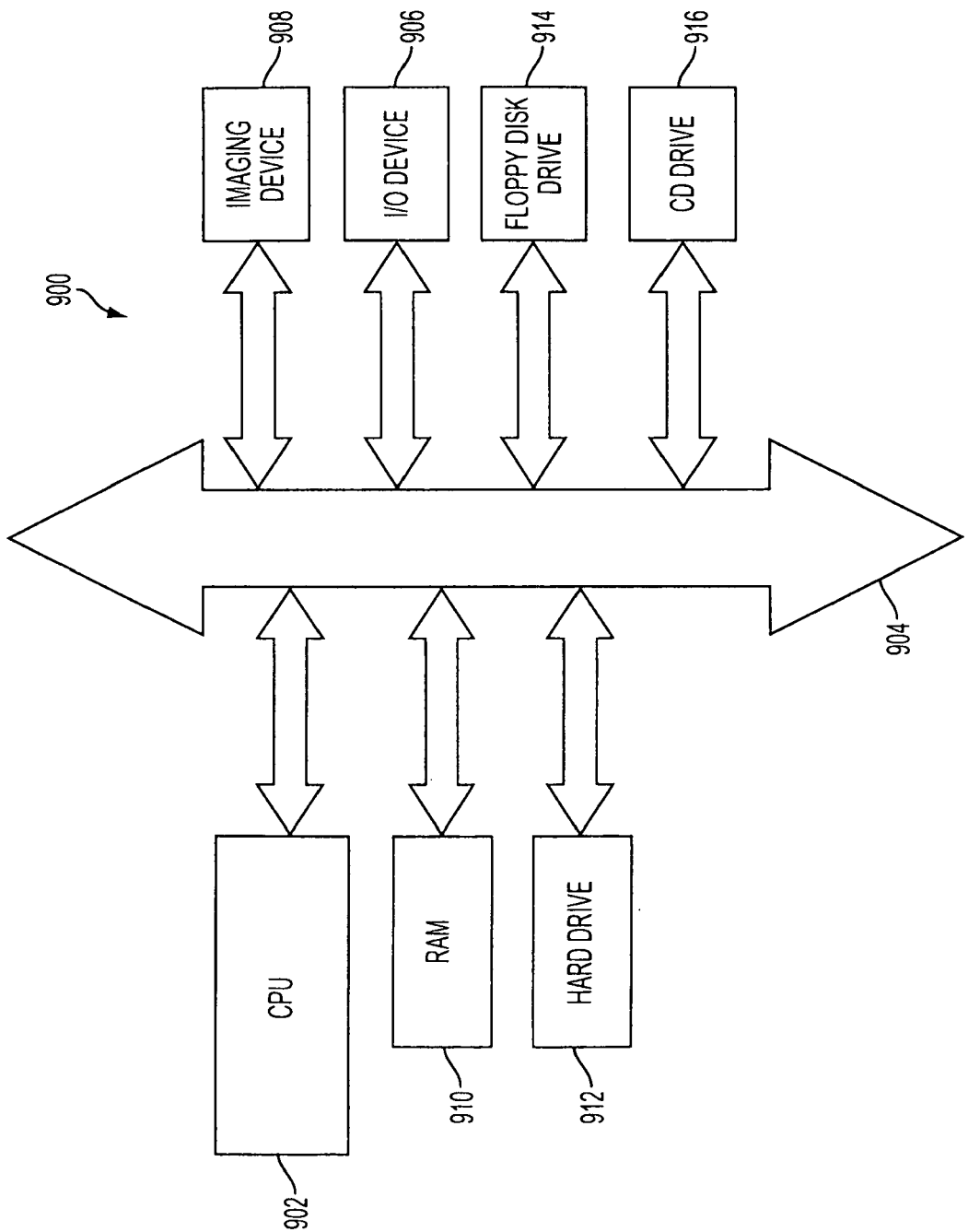
FIG. 12 is a diagram of a processing system which employs a CMOS imager having a pixel array in accordance with an embodiment of the invention.

FIG. 12 shows a processor system 900, which includes an imaging device 908 employing pixels constructed in accordance with any of the exemplary embodiments (FIGS. 2-11) of the invention. The imager device 908 may receive control or other data from system 900. System 900 includes a processor 902 having a central processing unit (CPU) that communicates with various devices over a bus 904. Some of the devices connected to the bus 904 provide communication into and out of the system 900; an input/output (I/O) device 906 and imager device 908 are such communication devices. Other devices connected to the bus 904 provide memory, illustratively including a random access memory (RAM) 910, hard drive 912, and one or more peripheral memory devices such as a floppy disk drive 914 and compact disk (CD) drive 916. The imager device 908 may be constructed as shown in FIG. 1 with the pixel array 200 having the characteristics of the invention as described above in connection with FIGS. 2-11. The imager device 908 may, in turn, be coupled to processor 902 for image processing, or other image handling operations. Examples of processor based systems, which may employ the imager device 908, include, without limitation, computer systems, camera systems, scanners, machine vision systems, vehicle navigation systems, video telephones, surveillance systems, auto focus systems, star tracker systems, motion detection systems, image stabilization systems, and others.

The devices described above illustrate typical devices of many that could be used. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A method of operating a plurality of pixels of an image sensor comprising:
    accumulating a first charge in a first photosensor;
    transferring said first charge from said first photosensor to a first storage device;
    transferring said first charge from said first storage device to a floating diffusion node;
    reading out the first charge from said floating diffusion node;
    accumulating a second charge in a second photosensor;

transferring said second charge from said second photosensor to a second storage device;

transferring said second charge from said second storage device to said floating diffusion node; and reading out the second charge from said floating diffusion node, wherein each of the first and second storage devices comprises a storage node and a capacitor, and wherein transferring said respective charges from said respective photosensors to said respective storage devices comprises turning on a respective shutter transistor, a gate of which is connected to said capacitor and a drain of which is connected to said storage node of said respective storage device.

2. The method of claim 1, wherein said capacitor of said first and second storage devices reside above a substrate in which the first and second photosensors reside.

3. The method of claim 1 further comprising the act of sharing said floating diffusion node with a third and fourth pixel, wherein said floating diffusion node is reset, said third pixel accumulates a third charge in a third photosensor, transfers said third charge from said third photosensor to a third storage device, transfers said third charge from said third storage device to said floating diffusion node and reads out the third charge from said floating diffusion node; and wherein said floating diffusion node is reset, said fourth pixel accumulates a fourth charge in a fourth photosensor, transfers said fourth charge from said fourth photosensor to a fourth storage device, transfers said fourth charge from said fourth storage device to said floating diffusion node and reads out the fourth charge from said floating diffusion node.

4. The method of claim 1, wherein a readout circuit outputs the first and second charges by:

turning on a first transfer gate of a first pixel to transfer the first charge to the floating diffusion node, and turning on a row select transistor; and turning on a second transfer gate of a second pixel after the readout of said first pixel to transfer the second charge to said floating diffusion node, and turning on said row select transistor.

5. The method of claim 4, wherein said transferring steps occur on half clock cycles.

6. A pixel circuit for use in an imaging device, said pixel circuit comprising:

a plurality of photosensors for generating charge during an integration period;

a plurality of shutter transistors, each shutter transistor connected to and transferring charge from a respective photosensor;

a plurality of storage nodes, wherein each storage node comprises a capacitor which is coupled to a respective shutter transistor via a shutter line and wherein each node stores charge transferred by a respective one of said plurality of photosensors;

a plurality of transfer transistors, each transfer transistor connected to and transferring charge from a respective storage node;

a floating diffusion node connected to said plurality of transfer transistors for receiving charge from said transfer transistors; and a readout circuit connected to said floating diffusion node to output charge accumulated at the floating diffusion node;

wherein said capacitor of each storage node is coupled to a gate portion of said respective shutter transistor.

7. The circuit of claim 6 wherein said readout circuit further comprises a reset transistor connected to said floating diffusion node for resetting the voltage on the floating diffusion node prior to receiving charge from a respective one said plurality of transfer transistors.

8. The circuit of claim 6, wherein said capacitors are formed above a substrate in which the floating diffusion node is formed.

9. The circuit of claim 8, wherein said capacitors are polypropylene capacitors.

10. The circuit of claim 6, wherein said shutter transistors operate as electronic shutters for said pixel.

11. The circuit of claim 6, wherein said shutter transistors remain on during the integration period.

12. The circuit of claim 6, wherein said pixel is a CMOS pixel.

13. The circuit of claim 6, wherein said pixel is a five transistor pixel.

14. A pixel circuit for use in an imaging device, said pixel circuit comprising:

a photosensor for generating charge during an integration period;

a shutter transistor connected to said photosensor to transfer charge from said photosensor;

a storage node connected to said shutter transistor;

a storage capacitor connected between a gate of said shutter transistor and said storage node, the storage capacitor receiving said charge transferred by said shutter transistor;

a transfer transistor connected to said storage node to transfer charge from said storage node;

a floating diffusion node connected to said transfer transistor to receive said charge from said transfer transistor;

a reset transistor connected to said floating diffusion node for resetting the voltage on the floating diffusion node;

a source-follower transistor connected to said reset transistor for receiving charge from the floating diffusion node; and a row select transistor connected to said source-follower transistor for outputting a signal produced by said source follower transistor, wherein a plurality of said photosensors, shutter transistors, storage capacitors and transfer transistors share said floating diffusion node, reset transistor, source follower transistor, and row select transistor.

15. The circuit of claim 14, wherein said pixel is a CMOS pixel.

16. An imaging system comprising:

a processor; and an imaging device comprising an array of pixels, coupled to said imaging system comprising:

a plurality of photosensors for generating charge during an integration period;

a plurality of shutter transistors, each shutter transistor connected to and transferring charge from a respective photosensor;

a plurality of storage nodes, each storage node connected to a respective shutter transistor;

a plurality of storage capacitors, each capacitor coupled between a gate of a respective shutter transistor and a respective storage node, the storage capacitor storing charge transferred by a respective one of said plurality of photosensors;

a plurality of transfer transistors, each transfer transistor connected to and transferring charge from a respective storage node;

a floating diffusion node connected to said plurality of transfer transistors for receiving charge from said transfer transistors; and a readout circuit connected to said floating diffusion node to output charge accumulated at the floating diffusion node.

17. The system of claim 16, wherein a number of said plurality of photosensors is two photosensors.

18. The system of claim 16, wherein a number of said plurality of photosensors is four photosensors.

19. The system of claim 16, wherein said shutter transistor is an electronic shutter.

20. The system of claim 16, wherein said shutter transistor remains on during the integration period.

21. The system of claim 16, wherein said capacitors are polypropylene capacitors.

22. The system of claim 16, wherein said imaging system is a CMOS imaging system.

* * * * *